(12) United States Patent
Nussbaum et al.

(10) Patent No.: US 8,516,305 B2
(45) Date of Patent: Aug. 20, 2013

(54) POWER DISSIPATION TEST METHOD AND DEVICE THEREFOR

(75) Inventors: Sebastien Nussbaum, Lexington, MA (US); Guhan Krishnan, Chelmsford, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 367 days.

(21) Appl. No.: 12/873,913

(22) Filed: Sep. 1, 2010

(65) Prior Publication Data

US 2012/0054547 A1    Mar. 1, 2012

(51) Int. Cl.
*G06F 11/00* (2006.01)
(52) U.S. Cl.
USPC ............... 714/32; 714/25; 714/28; 714/30
(58) Field of Classification Search
USPC ............... 714/25, 28, 30, 32, 37, 41
See application file for complete search history.

(56) References Cited

U.S. PATENT DOCUMENTS

| | | | | |
|---|---|---|---|---|
| 5,883,905 | A * | 3/1999 | Eastburn | 714/32 |
| 6,330,703 | B1 * | 12/2001 | Saito et al. | 714/30 |
| 6,363,510 | B1 * | 3/2002 | Rhodes et al. | 714/30 |
| 2010/0332925 | A1 * | 12/2010 | Lee et al. | 714/718 |

* cited by examiner

*Primary Examiner* — Joseph D Manoskey

(57) ABSTRACT

Dynamic power test slave (DPTS) modules are placed at selected locations of a data processing device to provide data to a logic module of the device at a high rate during testing of the device. The DPTS module intercepts data requests targeted to another logic module and the DPTS instead provides the requested data, thus simulating data transfer by the target logic module. The simulated data transfers can provide for transitions at the data processing device from a relatively high power state to a relatively low power state. Accordingly, the DPTS modules allow for simulation of expected normal operating conditions during testing of the data processing device.

20 Claims, 3 Drawing Sheets

POWER DISSIPATION TEST METHOD AND DEVICE THEREFOR

BACKGROUND

1. Field of the Disclosure

The present disclosure generally relates to data processing devices, and more particularly to testing data processing devices.

2. Description of the Related Art

Data processing devices are typically tested to ensure their operation complies with a specification. A conventional testing technique for data processing devices is referred to as scan testing. Scan testing can detect manufacturing faults, such as defective transistors and improper device interconnections. In addition, scan testing can be employed to verify that individual logic paths at the data processing device are capable of operating at a specified frequency. However, it can be difficult to test some functionality of a data processing device with scan testing and other testing techniques, such as loopback testing.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-5 illustrate devices and techniques to test a data processing device and identify functional problems with the device. Dynamic power test slave (DPTS) modules are placed at selected locations of a data processing device to provide data to a logic module of the device at a high rate during testing of the device. The DPTS module intercepts data requests targeted to another logic module and the DPTS instead provides the requested data, thus simulating data transfer by the target logic module.

The DPTS module can provide the requested data at a relatively high rate to simulate expected rates of data transfer that the data processing device can encounter when operating in a product. For example, a product incorporating the data processing device may include a memory external to the processing device for storing data information. During operation of the product, the data processing device can transfer data to and from the external memory at a high rate. In a conventional testing environment using automated test equipment (ATE), the external memory is not typically present, and the ATE is generally unable to transfer data to and from the data processing device at a speed that is sufficient to thoroughly validate correct operation of the data processing device. The DPTS, in contrast, can simulate memory transfers to and from the external memory, allowing the data processing device to be tested under expected worst-case operating conditions while testing the device in a conventional testing environment. The data processing device can therefore be subject to functional stresses that it can encounter while operating in a product. For example, the ATE can determine whether the data processing device is functional and complies with specification parameters such as current consumption, thermal dissipation, operating frequency, and the like.

Figure 1:
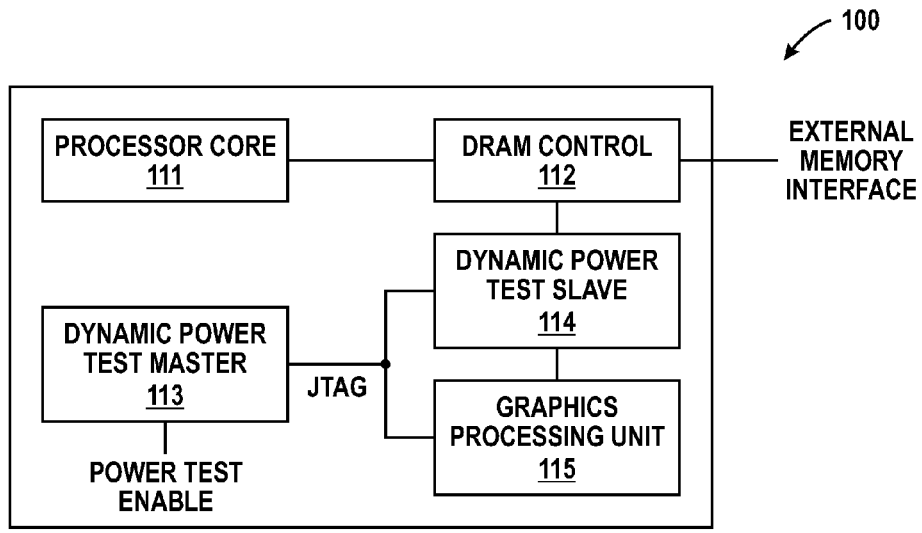
FIG. 1 is block diagram illustrating a data processing device in accordance with a specific embodiment of the present disclosure.

FIG. 1 is block diagram illustrating a simplified view of a data processing device 100 in accordance with a specific embodiment of the present disclosure. Data processing device 100 includes one or more processor cores 110, a dynamic random access memory (DRAM) control module 112, and a graphics processing unit (GPU) 115. These blocks represent a portion of logic modules that may be present in a conventional data processing device, such as an integrated circuit microprocessor. Also included at the data processing device 100 are a dynamic power test master (DPTM) 113 and a dynamic power test slave (DPTS) 114. The processor core 110 is connected to DRAM control module 112. The DRAM control module 112 includes terminals for interfacing to an external memory device (not shown at FIG. 1). The GPU 115 is connected to the DRAM control module 112 via the DPTS 114. The DPTM 113 has an input to receive a signal labeled POWER TEST ENABLE, and a Joint Test Action Group (JTAG) interface connected to the DPTS 114 and the GPU 115.

It will be appreciated that the data processing device 100 can operate in different environments. As used herein, an environment refers to the conditions under which a device operates, and includes the other devices, interfaces, and other modules to which a device is connected, the power supplied to the device, the temperature conditions, and other such conditions. For example, as described herein, the data processing device 100 can be placed in a testing environment for testing whether the device operation complies with a specification. If the device complies with the specification, it can be incorporated into a product where it can operate in a normal environment and perform its intended function. In the testing environment, the data processing device 100 can be placed in a testing device that supplies power to the data processing device, interfaces with the data processing device via a debug interface, and the like. In a normal operating environment, the data processing device 100 can be mounted on a printed circuit board and connected to external memory and other external devices. Although it is typically desirable for the testing environment to mimic the extreme conditions that the data processing device may encounter while operating in a normal environment, it can be difficult and expensive to match the environments closely. Accordingly, in the test environment, the data processing device 102 is typically not connected to the same external devices, such as external memory, to which it will be connected in the normal operating environment. For purposes of discussion herein, the data processing device 102 is referred to as in "normal operation" when it is in the normal operating environment, and in "test operation" when it is undergoing testing in the test environment.

During normal operation, the GPU 115 can request data from the external memory device via the DRAM control module 112 and receive the requested data at a particular rate. In an embodiment, during test operation automated test equipment cannot supply data to the GPU 115 at the same rate. However, during test operation the DPTS 114 can respond to data requests issued by the GPU 115 by providing data to the GPU 115 at a high rate relative to the rate that can be provided by the automated test equipment. Accordingly, the DPTS 114 allows for testing the data processing device 100 under conditions that simulate predicted normal operating conditions. For example, by using the DPTS 114 to simulate bus transfer activity that is expected to be encountered during normal operation, a power test procedure can identify device failures caused by excessive power consumption, excessive current densities at local device interconnects, dynamic fluctuations in current, and the like.

To illustrate, in test operation, the data processing device 100 can undergo a power test procedure to test the effect of power fluctuations on the operation of the device. During a power test procedure, the DPTM 113 configures the DPTS 114 to intercept data requests from the GPU 115 that are directed to an external memory device (via the DRAM control module 112). In an embodiment, the DPTS 114 can respond to the requests for data faster than the DRAM control module 112 can receive the requested data from automatic test equipment (ATE) via the external memory interface. During testing, the ATE can measure power consumed by the data processing device and can detect functional failures resulting from changes in the amount of power consumed by the data processing device 100. In another embodiment, the power test procedure can simulate data transfer activity at the data processing device 100 that exceeds levels that are likely during normal operation in a product, to provide additional test margin (guard banding).

In addition, during normal operation different modules of the data processing device 100 can operate in disparate and asynchronous clock domains. During test operation, the disparate and asynchronous clock domains are typically operated synchronously to guarantee deterministic behavior of the device so that test results can be synchronized to test inputs. However, because the DPTS 114 can provide data transfers at substantially the same rate as during normal operation of the data processing device 100, asynchronous operation of the different clock domains can be more accurately tested. The testing features of the data processing device 100 can be better understood with reference to FIG. 2.

Figure 2:
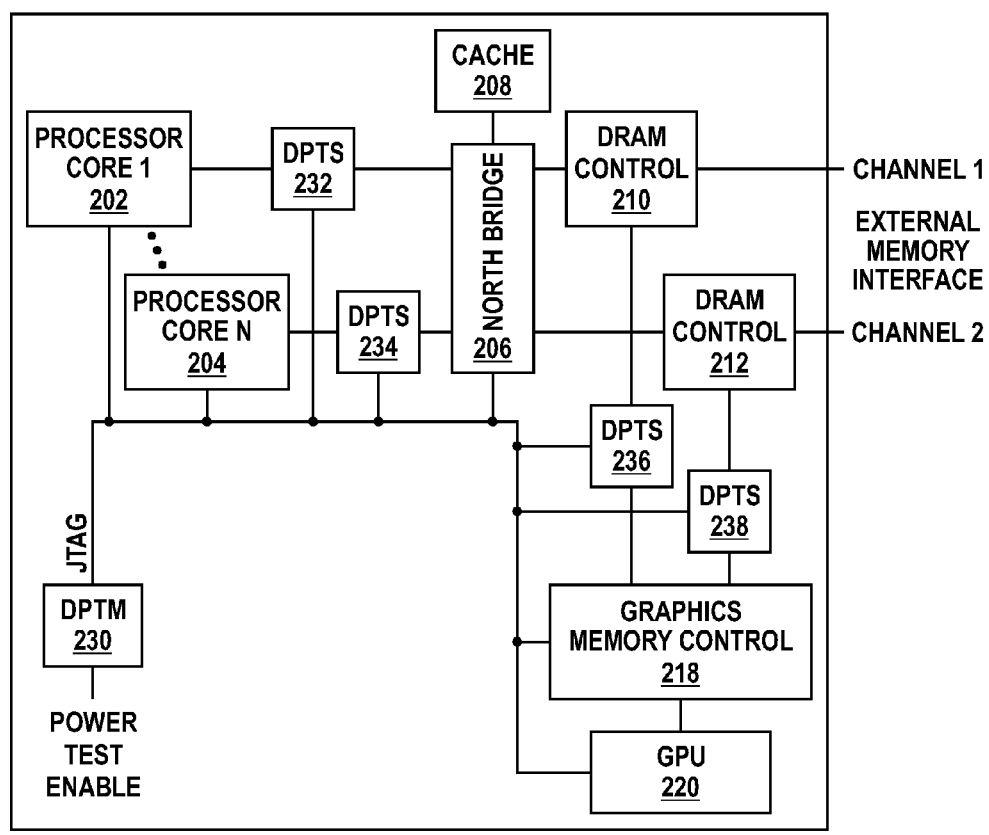
FIG. 2 is block diagram illustrating another data processing device in accordance with a specific embodiment of the present disclosure.

FIG. 2 is block diagram illustrating another data processing device 200 in accordance with a specific embodiment of the present disclosure. Data processing device 200 includes a processor core 202, a processor core 204, a north bridge module 206, a cache module 208, a DRAM control module 210, another DRAM control module 212, a graphics memory control module 218, and a GPU 220. These blocks represent a portion of logic modules that may be present in a conventional data processing device, such as an integrated circuit microprocessor. Also included at the data processing device 200 are power test modules including a DPTM 230, a DPTS 232, a DPTS 234, a DPTS 236, and a DPTS 238.

The processor core 202 is connected to the north bridge 206 via the DPTS 232. The processor core 204 is connected to the north bridge 206 via the DPTS 234. The north bridge 206 is also connected to the cache 208, the DRAM control module 210, and the DRAM control module 212. The DRAM control module 210 is connected to CHANNEL 1 of an external memory interface, and the DRAM control module 212 is connected to CHANNEL 2 of the external memory interface. The GPU 220 is connected to the graphics memory control module 218. The graphics memory control module 218 is connected to the DRAM control module 210 via the DPTS 236 and to the DRAM control module 212 via the DPTS 238. The DPTM 230 has an input for receiving a signal labeled POWER TEST ENABLE, and is connected to the processor core 202, the processor core 204, DPTS 232-238, graphics memory control module 218, and GPU 220 via a JTAG interface. For clarity, additional logic module, test modules, and interconnections are not illustrated at FIG. 2. For example, the north bridge 206, the cache 208, and other logic modules can include a JTAG interface to support traditional scan-based testing.

During test operation, the power test modules 230-238 can be configured to operate in a power test mode by asserting the signal POWER TEST ENABLE in order to conduct a power test procedure. During the power test procedure, the DPTM 230 configures DPTS 232 to respond to data requests received from the processor core 202. The data requests issued by processor core 202 are directed at the north bridge 206, but are intercepted by the DPTS 232. In a similar manner, the DPTS 234 is configured to respond to data requests (again directed at the north bridge 206) that are received from the processor core 204. The DPTS 236 is configured to respond to data requests received from the graphics memory control module 218, the data requests directed at the DRAM control module 210.

In normal operation, the graphics memory control module 218 issues data requests to the DRAM control module 210 to fetch data stored at a memory device (not shown) connected to CHANNEL 1 of the external memory interface. In an embodiment, during test operation automatic test equipment is unable to supply data at the external memory interface of the data processing device 200 at the maximum rate that a memory device is capable of providing data in a product. In order to exercise the GPU 220 and the graphics memory control module 218 at their specified maximum operating data-bandwidth during the test procedure, the DPTS 236 provides the requested data at a relatively high data rate, and thus simulates the operation of DRAM control module 210 accessing a memory device during normal operation. In a similar manner, the DPTS 238 is configured to respond to data requests received from the graphics memory control module 218 and directed at CHANNEL 2 of the external memory interface. Therefore, the DPTS 236 and the DPTS 238 can operate in lock step with the GPU 220 so that the GPU 220 can send and receive data at a rate that can be experienced during normal operation.

The operation of each DPTS, of DPTS 232-238, can be configured by the DPTM 230 via a JTAG interface, via another standard interface, or via a proprietary interface. Data (pattern data) provided by each DPTS to simulate data transfers that are normally provided by another logic module is stored at a read only memory (ROM) at the DPTM 230. In response to an assertion of signal POWER TEST ENABLE, the DPTM 230 transfers respective pattern data to a static random access memory (SRAM) located at each corresponding DPTS module. The DPTM 230 also can initialize selected logic modules, such as the processor core 202, to a predetermined state using traditional scan technique, whereby the logic modules are configured to perform the power test. Having completed this initialization process, the DPTM 230 can initiate the power test procedure.

For example, the DPTM 230 can initialize an instruction pointer at the processor core 202 to select a set of program instructions. The program instructions can implement a software routine configured to fetch data from the external memory interface and manipulate the received data in a particular manner. The DPTS 232 can instead intercept the data requests and provide the requested data to the processor core 202 using pattern data stored at the SRAM located at the DPTS 232. The ATE can monitor power consumption at the data processing device 200 while the power test procedure is underway to determine if power dissipation exceeds a predetermined value. Following completion of the power test procedure, the state of the processor core 202 can be evaluated using scan logic or other test methods to determine if any error occurred during the power test procedure.

Pattern data stored at the SRAM located at the DPTS 232 can represent any information that is normally provided to the processor core 202 by the north bridge 206. For example, the pattern data stored at the DPTS 232 can represent operands associated with program instructions or another type of data information. In addition to providing a means to overcome speed limitations of automatic test equipment, DPTS 232 can be used to simulate activities and operations at data processing device 200 that would otherwise require a time consuming initialization procedure. For example, the DPTS 232 can provide data to the processor core 202 that simulates successive cache-hits at the cache 208 without having to store the corresponding data at the cache 208. The DPTS 232 also can be used to reduce the time required to conduct a power test procedure. For example, the DPTS 232 can provide information to the processor core 202 to emulate execution of a boot sequence associated with an input/output device. The operation of the DPTM 230 and the DPTS modules is described below in detail with reference to FIGS. 3-6.

In an embodiment, multiple DPTS included at the data processing device 200 can simulate a plurality of data transfers simultaneously to more accurately model device activity associated with normal operation of the device. For example, during normal operation, different interfaces of the data processing device 100 may transfer data to or from the device concurrently. As used herein, concurrent transfers occur simultaneously or overlapping in time. The DPTS modules can simulate these transfers by concurrently simulating transfers at more than one DPTS. Thus, DPTS 232 can simulate a data transfer simultaneously or concurrently with the simulation of a data transfer at DPTS 236.

In another embodiment, a DPTS such as the DPTS 232 can be configured to simulate a plurality of data transfers that cause one or more portions of the data processing device 200 to transition from a high power state (where the one or more portions consume a relatively high amount of power) to a low power state (where the one or more portions consume a relatively low amount of power), or from a low power state to a high power state. Because these transitions between power states can produce voltage transients at power distribution signals or at logic signals that can cause a functional failure during normal operation, the DTPS can provide for better simulation of normal operation during test operation of the device.

Figure 3:
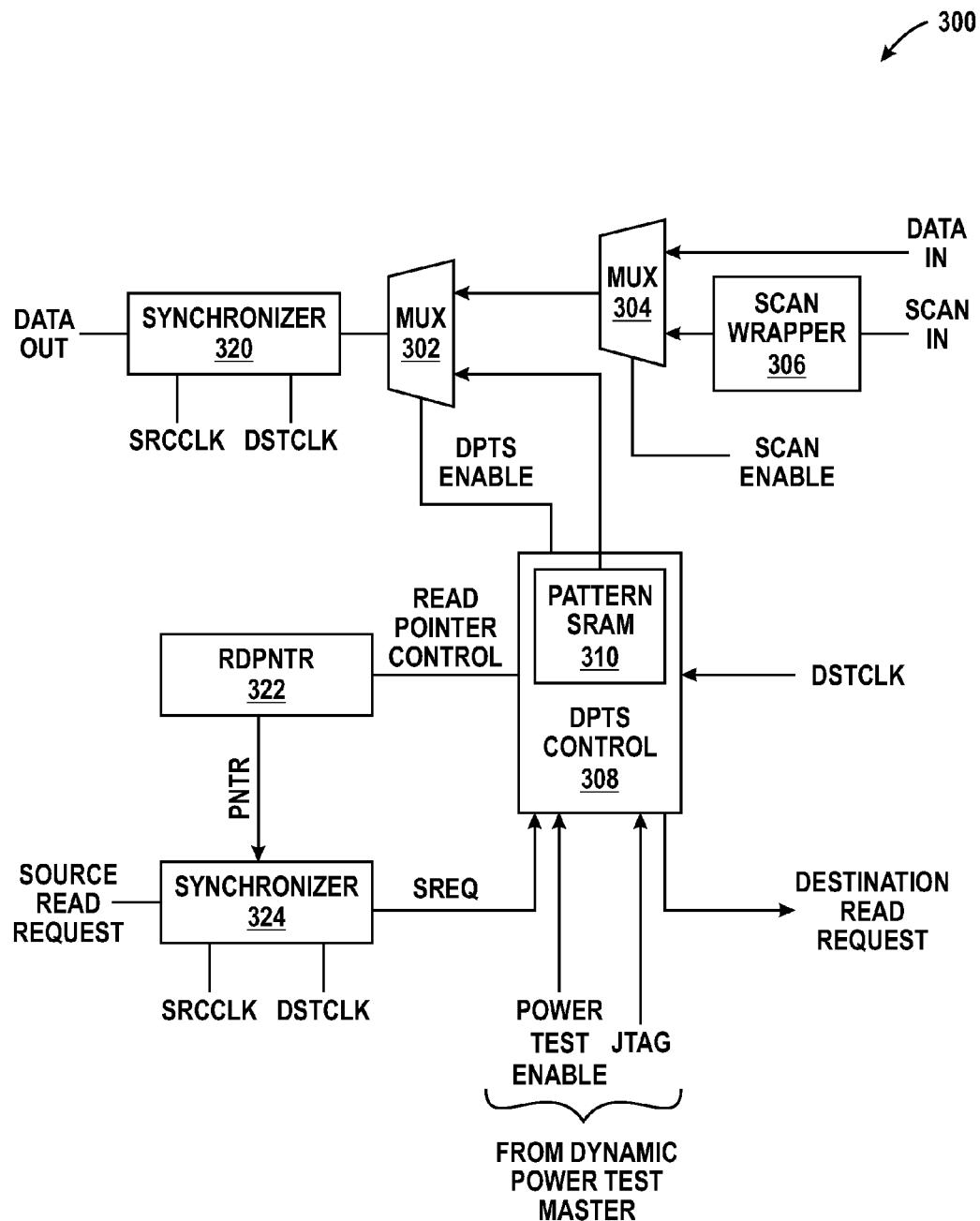
FIG. 3 is a block diagram illustrating a dynamic power test slave in accordance with a specific embodiment of the present disclosure.

FIG. 3 is a block diagram illustrating a DPTS 300 in accordance with a specific embodiment of the present disclosure. The DPTS 300 is similar to the DPTS 114 included at data processing device 100 of FIG. 1 and similar to each of the DPTS modules at data processing device 200 of FIG. 2. The DPTS 300 includes a multiplexor 302, another multiplexor 304, a scan wrapper 306, a DPTS control module 308, a data synchronizer 320, a read pointer 322, and a read request synchronizer 324. The DPTS control module 308 includes a pattern SRAM 310. Multiplexor 304 has a data input connected to node DATA IN, another data input connected to node SCAN IN via the scan wrapper 306, a selection input for receiving a signal labeled SCAN ENABLE, and an output connected to a data input of multiplexor 302. The multiplexor 302 has another data input connected to the DPTS control module 308, a selection input for receiving a signal labeled DPTS ENABLE from the DPTS control module 308, and an output connected to an input of data synchronizer 320. Data synchronizer 320 has an output connected to node DATA OUT. The DPTS control module 308 also includes an input for receiving a signal labeled POWER TEST ENABLE, an input for receiving a synchronized read request signal labeled SREQ, an output for providing a signal labeled DESTINATION READ REQUEST, an output for providing a signal labeled READ POINTER CONTROL, an input for receiving a clock signal DSTCLK, and a JTAG interface. The read pointer 322 has an input to receive signal READ POINTER CONTROL and an output for providing a signal to the read request synchronizer 324 labeled PNTR. Read request synchronizer 324 has an input for receiving a signal labeled SOURCE READ REQUEST, an input for receiving signal PNTR, an input for receiving a source clock signal labeled SRCCLK, an input for receiving a destination clock signal DESTCLK, and an output for providing signal SREQ.

The DPTS 300 is configured to operate in a power test mode in response to assertion of signal POWER TEST ENABLE. While operating in the power test mode, the DPTS 300 can respond to data requests (identified by the assertion of signal SREQ) by providing pattern data, stored at the pattern SRAM 310, to node DATA OUT at the output of the multiplexor 302. For example, with reference to FIG. 1, the DPTS 114 can intercept requests issued by the GPU 115 that are directed to the DRAM control module 112 if the DPTS 114 is configured to operate in the power test mode, and provide the requested information using data stored at the pattern SRAM 310.

If signal POWER TEST ENABLE is not asserted, information provided at node DATA OUT can originate from one of two sources based on the logic state of signal SCAN ENABLE. Under normal operating conditions signal SCAN ENABLE is negated and the multiplexor 302 and the multiplexor 304 are configured to receive information at node DATA IN and simply forward the information to node DATA OUT without further modification. Furthermore, the DPTS 300 can forward read requests received via signal SREQ to a destination logic module that will provide the requested data at node DATA IN. For example, with reference to the DPTS 114 of FIG. 1, the DTPS 300 can forward information received from the DRAM control module 112 to the graphics processing unit 115.

The read request synchronizer 324 is configured to synchronize signal SOURCE READ REQUEST if the logic module issuing the read request operates in a different clock domain than the logic module to which the request is directed. For example, the read request synchronizer 324 can translate signal SOURCE READ REQUEST generated in a SRCCLK clock domain to signal SREQ that is synchronous to a DESTCLK clock domain. The signal PNTR is asserted by the read pointer 322 to acknowledge receipt of signal SOURCE READ REQUEST at the DPTS 300. During normal operation, signal PNTR is generated based on an acknowledgement signal received from a destination logic module. The read request synchronizer 324 is not needed if the logic module issuing the read requests operates within the same clock domain as the destination logic module that services the request under normal operating conditions. In a similar manner, the data synchronizer 320 is configured to receive data provided by the DPTS 300 that is generated within the DESTCLK clock domain and synchronize the data with the SRCCLK clock domain.

In an embodiment, the data synchronizer 320 is not employed when the logic module issuing the read requests operates within the same clock domain as the destination logic module that services the request under normal operating conditions. The DPTS 300 can instead operate within the SRCCLK clock domain and synchronization circuitry can be included on the destination side of the DPTS 300 at signal DATA IN and signal DESTINATION READ REQUEST. Providing synchronization as shown at FIG. 3 can be advantageous because correct operation of the data synchronizer 320 is verified during the power test operation.

If signal SCAN ENABLE is asserted, data provided by the scan wrapper 306 is provided to node DATA OUT. The scan wrapper 306 and the multiplexor 304 are similar to components that may be included at the interfaces of a logic module to provide conventional boundary scan capabilities. In other words, a traditional boundary scan implementation supports selecting between mission data (data that is received from another logic module during normal operation via node DATA IN) and scan data (data received during scan testing from node SCAN IN), based on the value of signal SCAN ENABLE. Thus, the DPTS 300 provides an additional source of data that can be provided at node DATA OUT, such as data stored at pattern SRAM 308.

During an initialization process, a DPTM (not shown) can store pattern at the pattern SRAM 310 using the JTAG interface. For example, with reference to FIG. 1, the DPTM 113 can transfer pattern data stored at a ROM at the DPTM 113 to a pattern SRAM at the DPTS 114 using the JTAG interface. During a power test procedure, the DPTS 300 can intercept data requests directed towards another logic module, and respond to the data request by providing data stored at the pattern SRAM 310 at node DATA OUT, thus simulating an actual response from the intended target of the request. In an embodiment, the DPTS control module 308 can include a micro-controller (not shown at FIG. 3) or other logic modules suitable for managing communication over the JTAG interface and for overseeing the generation of responses to data requests. For example, the DPTM can provide instructions to a microcontroller at the control module 308 that configure the DPTS 300 to respond to selected data transfer requests.

FIG. 3 illustrates circuitry associated with a read operation, wherein a request for data is received via the signal SOURCE READ REQUEST and data is provided at node DATA OUT. The DPTS 300 can also include circuitry associated with a write operation, not shown at FIG. 3, wherein data is provided by a source logic module, such as the GPU 115 to be written to a destination logic module, such as the DRAM control module 112. In an embodiment, the DPTS 300 can store data received from the source logic module at an SRAM (not shown) while operating in the power test mode. In another embodiment, data received from the source logic module can be processed by a cyclic redundancy check (CRC) logic module to provide a data signature indicative of the values of data received from the source logic module during the power test operation. In still another embodiment, data received from the source logic module during a write operation can be stored at an SRAM and incorporated with data provided by the DPTS 300 during a read operation. Alternatively, data received at the DPTS 300 during a write operation can be discarded.

Figure 4:
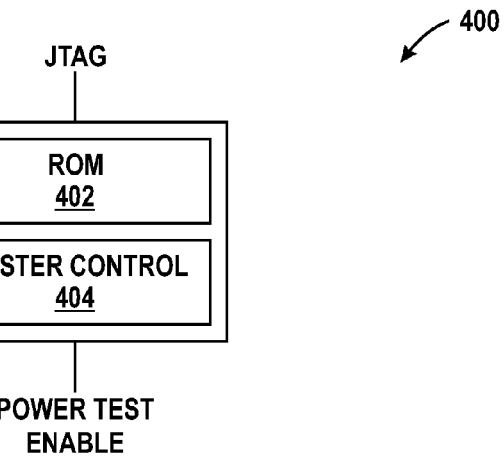
FIG. 4 is a block diagram illustrating a dynamic power test master in accordance with a specific embodiment of the present disclosure.

FIG. 4 is a block diagram illustrating a DPTM 400 in accordance with a specific embodiment of the present disclosure. The DPTM 400 includes a ROM 402 and a master control module 404. The DPTM 400 has an input for receiving a signal labeled POWER TEST ENABLE and a JTAG interface. The DPTM 400 is configured to initialize and control one or more DPTS modules. In particular, the DPTM 400 can transfer pattern data stored at the ROM 402 to a pattern SRAM at a DPTS module, and configure the DPTS to respond to selected data requests. The master control module 404 can include a micro-controller operable to execute program instructions, hard-wired logic modules, or a combination thereof. The ROM 402 can store pattern data and can store program instructions and other information used by the master control module 404 to initialize, configure, and manage a power test procedure. In an embodiment, the DPTM 400 can include a RAM or a non-volatile memory (not shown at FIG. 4), that can store information that can be used to update or override information stored at the ROM 402. For example, a power test procedure specified by information at the ROM 402 can be updated after the data processing device 100 has been fabricated based on revised information provided by the RAM.

A power test procedure can be initiated and managed by assertion of signal POWER TEST ENABLE. For example, automated test equipment can assert signal POWER TEST ENABLE during test operation. Signal POWER TEST ENABLE can be communicated over a single conductor using binary encoding, or can represent an associated serial or parallel interface using a standard or proprietary interface protocol, such as a JTAG interface protocol. Pattern data and other information stored at the ROM 402 can be encoded or otherwise compressed to provide efficient use of available storage space. The DPTM can decode the information stored at the ROM 402 when the DPTM retrieves the information from the ROM 402, or pattern data can be decoded at a DPTS module after the DPTS receives the pattern data from the DPTM 400.

Figure 5:
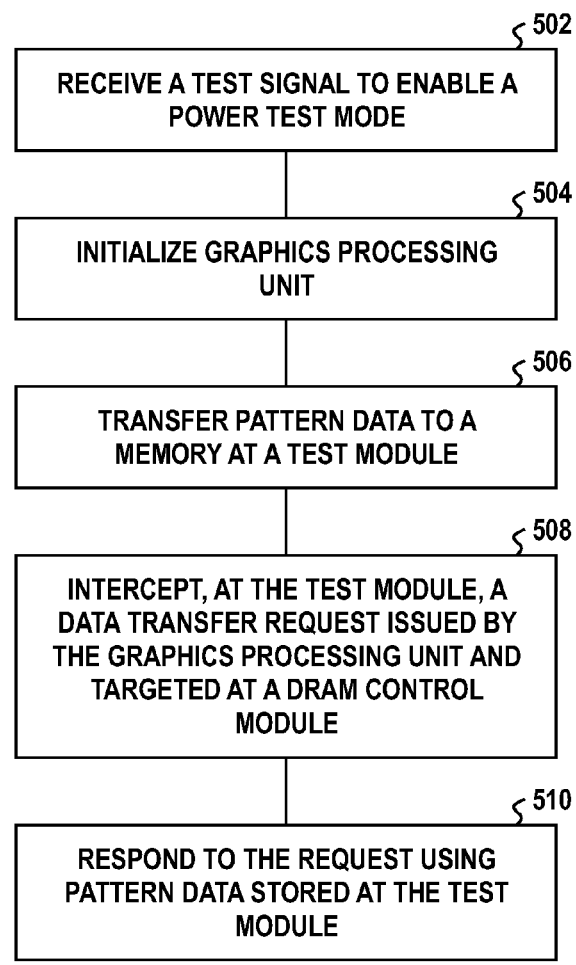
FIG. 5 is a flow diagram illustrating a method in accordance with a specific embodiment of the present disclosure.

FIG. 5 is a flow diagram illustrating a method 500 in accordance with a specific embodiment of the present disclosure. Method 500 begins at node 502 where a power test mode of operation of a data processing device can be enabled in response to an assertion of a test signal. For example, signal POWER TEST ENABLE can be received at the DPTM 113 of FIG. 1. The flow proceeds to node 504 where the DPTM 113 can initialize a logic module in preparation for testing. For example, the DPTM 113 can use a JTAG interface to place the GPU 115 into a predetermined logic-state that corresponds to pattern data that will be provided by the DPTS 114 during a power test procedure. For example, the GPU 115 can be initialized to a reset state, wherein the GPU 115 is ready to fetch graphics data from an external memory. During the power test procedure, the DPTS can operate in lock step with the GPU 115, providing data in response to the requests issued by the GPU 115. The flow proceeds to node 506 where pattern data can be transferred to a memory at a test module. For example, the DPTM 113 can transfer pattern data from a ROM included at the DPTM 113 (such as ROM 402 at the DPTM 400 of FIG. 4) to a SRAM at the DPTS 114 (such as pattern SRAM 310 at DPTS 300 of FIG. 3). The flow proceeds to node 508 where a data transfer request is intercepted by the test module. For example, the GPU 115 can issue a data transfer request that is directed at dram control module 112. During normal operation, the DRAM control module 112 can fulfill the request by supplying the requested data to the GPU 115. The flow proceeds to node 510 where the test module responds to the data transfer request. For example, when operating in the power test mode, pattern data stored at the SRAM 310 of the DPTS 300 can be provided to the GPU 115 to fulfill the data transfer request. During a power test procedure, the DPTM 113 can continuously or periodically configure the operation of the DPTS 114 (and of other DPTS modules if needed).

Devices and methods disclosed herein provides an economical technique to more fully validate the operation of a data processing device during testing at automatic test equipment, and without the need to utilize impractical and unreliable in-situ platform testing. Platform testing is a procedure in which each data processing device is installed in a test fixture that resembles an actual product that includes the data processing device. The test fixture can perform operations that emulate real-world applications. Platform testing is not only time consuming and expensive, but does not provide the degree of accuracy and deterministic behavior possible using ATE and the disclosed techniques. Furthermore, techniques disclosed herein can be utilized to implement a power-on self-test of a data processing device at a final product. The power-on self-test can be initiated by a basic input/output system (BIOS) routine or by a design for test (DFT) controller internal to the data processing device. For example, a data processing device can include a DPTS and an associated DPTM to simulate data transfers and corresponding device operations to cause the data processing device to consume a high amount of power. The self-test can be used to verify proper operation of on-die thermal sensors, of thermal dissipation components such as cooling fans, of power supply regulators, and the like, and to verify functional stability of a product in the presence of voltage droop or current spikes that may result from the simulated data transfers.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
    during a test mode of operation of a data processing device, transferring first response data from a first test module of the data processing device to a second test module of the data processing device;
    during the test mode of operation, intercepting at the second test module a first data transfer request issued by a first logic module and directed at a first external device;
    during the test mode of operation, responding to the first data transfer request using the first response data; and
    providing information indicative of a power consumption of the data processing device based on the responding.

2. The method of claim 1, further comprising determining a functional error of the data processing device based on the responding.

3. The method of claim 1, wherein the first logic module is configured to interface with a device external to the data processing device.

4. The method of claim 1, further comprising:
    during the test mode of operation, transferring second response data from the first test module of the data processing device to a third test module of the data processing device;
    during the test mode of operation, receiving at the third test module a second data transfer request issued by a second logic module of the data processing device and directed at a second external device; and
    during the test mode of operation, responding to the second data transfer request using the second response data.

5. The method of claim 4, wherein determining the power consumption comprises determining the power consumption based on the responding to the first data transfer request and the responding to the second data transfer request.

6. The method of claim 4, wherein responding to the second data transfer request comprises responding to the second data transfer request concurrently with the first data transfer request.

7. The method of claim 4, wherein the first logic module comprises a first interface of the data processing device configured to interface with an external device and the second logic module comprises a second interface of the data processing device.

8. The method of claim 1, wherein the first response data simulates data to be received at the data processing device in response to a cache hit.

9. The method of claim 1, wherein the first response data simulates data to be received at the data processing device during a boot sequence.

10. The method of claim 1, wherein transferring the first response data comprises transferring a plurality of test patterns from a memory of the first test module to a memory of the second test module.

11. The method of claim 1, further comprising:
    during the test mode of operation, providing a set of instructions to a controller device of the second test module; and
    responding to the first data transfer request based on the set of instructions.

12. A method, comprising:
    in a first test mode, responding to a first data transfer request targeted to a first external device and issued by a first logic module of a data processing device by providing data from a first test module of the data processing device to the first logic module via a first data interface; and
    in a second test mode, providing a test pattern stored at a scan chain to the first logic module via the first data interface.

13. The method of claim 12, further comprising:
    in the first test mode:
    storing a plurality of test patterns at a memory of the first test module; and
    providing the plurality of test patterns to the first logic module in response to a plurality of data transfer requests.

14. The method of claim 13, further comprising:
    in the first test mode, transferring the plurality of test patterns from a second test module of the data processing device to the memory of the first test module.

15. A device, comprising:
    a first module to provide a first data transfer request targeted to a second module;

a first data interface coupled to a processor core to receive the first data transfer request; and a first test module coupled to the first data interface and comprising an input to receive a first test signal, the first test module to intercept and respond to the first data transfer request based on the first test signal, the first test module different from the first module.

16. The device of claim 15, wherein the first test module comprises:

a first memory to store a plurality of test patterns; and a first controller module to provide a first test pattern of the plurality of test patterns in response to the first data transfer request.

17. The device of claim 16, further comprising a second test module coupled to the first test module, the second test module to transfer the plurality of test patterns to the first memory in response to the first test signal.

18. The device of claim 16, further comprising a second test module coupled to the first test module, the second test module to transfer a set of instructions to the first controller module in response to the first test signal, the first controller module to provide the first test pattern based on the set of instructions.

19. The device of claim 16, wherein the first test module comprises a second input to receive scan data, and further comprises a plurality of storage elements to store the scan data, the first test module to transfer the scan to the processor core in response to a second test signal.

20. The device of claim 15, further comprising:

a second data interface coupled to the processor core to receive a second data transfer request targeted to a second module; and a second test module coupled to the second data interface comprising an input to receive the first test signal, the second test module to respond to the second data transfer request based on the first test signal, the second test module different from the second module.

* * * * *